(12) United States Patent
Yonezawa et al.

(10) Patent No.: US 6,795,802 B2
(45) Date of Patent: Sep. 21, 2004

(54) APPARATUS AND METHOD FOR CALCULATING TEMPORAL DETERIORATION MARGIN AMOUNT OF LSI, AND LSI INSPECTION METHOD

(75) Inventors: Hirokazu Yonezawa, Hyogo (JP); Yoshiyuki Kawakami, Osaka (JP); Nobufusa Iwanishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 741 days.

(21) Appl. No.: 09/810,518

(22) Filed: Mar. 19, 2001

(65) Prior Publication Data

US 2002/0022949 A1 Feb. 21, 2002

(30) Foreign Application Priority Data

Mar. 17, 2000 (JP) ........................................ 2000-076087

(51) Int. Cl.[7] ........................... G06F 17/10; G06F 17/50
(52) U.S. Cl. ................................ 703/19; 703/2; 703/14
(58) Field of Search .............................. 703/2, 14, 19; 702/117; 714/33, 55; 326/80

(56) References Cited

U.S. PATENT DOCUMENTS

| | | | |
|---|---|---|---|
| 5,533,197 A | 7/1996 | Moran et al. .................. | 714/55 |
| 5,634,001 A | 5/1997 | Mittl et al. .................... | 714/33 |
| 5,661,413 A * | 8/1997 | Tomita et al. ................. | 326/80 |
| 5,974,247 A | 10/1999 | Yonezawa ..................... | 703/19 |
| 6,047,247 A | 4/2000 | Iwanishi et al. ............ | 702/117 |
| 6,278,964 B1 * | 8/2001 | Fang et al. .................... | 703/19 |

FOREIGN PATENT DOCUMENTS

| | | |
|---|---|---|
| JP | 10-124565 | 5/1998 |
| JP | 11-219380 A | 8/1999 |
| JP | 3046269 | 3/2000 |

OTHER PUBLICATIONS

Yonezawa et al., H. Ratio Based Hot–Carrier Degradation Modeling for Aged Timing Simulation of Millions of Transistors Digital Circuits, Electron Devices Meeting, IEDM '98, IEEE, Dec. 1998, pp. 93–96.*
Chang et al., C–W. Layout–Driven Hot–Carrier Degradation Minimization Using Logic Restructuring Techniques, Proceedings of the 38th Conference on Design Automation, Jun. 2001, pp. 97–102.*
Y. Kawakami et al., "Gate–Level Aged Timing Simulation Methodology for Hot–Carrier Reliability Assurance", Proc. ASP–DAC 2000, IEEE, Jan. 28, 2000, pp. 289–294.
"Glacier User's Manual", BTA Technology, Inc., pp. 0–102, 1997–1998.

* cited by examiner

Primary Examiner—Russell Frejd
(74) Attorney, Agent, or Firm—McDermott Will & Emery LLP

(57) ABSTRACT

The present invention makes it possible to obtain an aging deterioration margin amount including an allowance for aging deterioration in a simplified manner. Moreover, in order to allow an appropriate inspection taking aging deterioration into account, a delay deterioration rate predicting part 101 outputs signal path delay information before deterioration 302 and signal path delay deterioration rate information 303 for each signal path, based on LSI design information 301. A delay vs. delay deterioration rate analyzing part 102 outputs delay vs. delay deterioration rate relationship information 304 showing the correlation between the delay and the delay deterioration rate based on the information. A delay deterioration rate extracting part 103 extracts a delay deterioration rate of a predetermined signal path and outputs it as delay deterioration margin 305. A delay deterioration margin amount calculating part 104 calculates a delay deterioration margin amount by using the delay deterioration margin 305 as a derating factor G. Furthermore, a inspection operation frequency calculating part 105 calculates an operation frequency for inspection using the delay deterioration margin 305 as a derating factor G.

15 Claims, 11 Drawing Sheets

FIG. 6

| Signal path | Signal path delay before deterioration tfresh(ns) (Signal path delay information before deterioration 302) | Signal path delay after deterioration taged(ns) | Signal path delay deterioration rate R = taged/tfresh (Signal path delay deterioration rate information 303) |
|---|---|---|---|
| Path 1 | 3.0 | 3.036 | 1.012 |
| Path 2 | 4.7 | 4.771 | 1.015 |
| ⋮ | ⋮ | ⋮ | ⋮ |
| Path M | 0.3 | 3.090 | 1.030 |

APPARATUS AND METHOD FOR CALCULATING TEMPORAL DETERIORATION MARGIN AMOUNT OF LSI, AND LSI INSPECTION METHOD

BACKGROUND OF THE INVENTION

The present invention relates to a technique for predicting aging property deterioration of a large scale semiconductor integrated circuit (hereinafter, abbreviated as LSI) caused by the hot carrier phenomenon (deterioration) or the like, and obtaining a suitable aging deterioration margin amount as an allowance to be made at time of designing LSIs or inspecting LSIs.

In recent years, LSIs have reached the point where several ten million or more MOS transistors are integrated to realize various functions on one chip. In such LSIs, it is necessary that a tolerance, that is, a margin amount is included for various properties in the design stage so that the LSIs can operate normally, even if the supply voltage or the temperature used are varied, or the properties are not uniform. In the following description, delay of signals is used as an example of the margin amount.

In general, a LSI can be disintegrated into a plurality of basic units, each of which includes a certain number of stages of circuits 22 (N stages in FIG. 1) between, for example, flip-flops 21, 21, that is, a plurality of signal paths 20, as shown in FIG. 1. Each of the circuits 22 includes logic circuits and wiring connecting these logic circuits in many cases. The delay of a signal when the signal propagates through a series of circuits 22 of the signal path 20 is required to be within a predetermined period of time, that is, a cycle time (the inverted number of the operation frequency or the clock frequency in many cases) of a clock signal 23 supplied to the flip-flops 21, 21, as shown in the following equation (1).

$$t \text{ cycle} \geq \Sigma ti + K (i=1 \text{ to } N) \tag{1}$$

where t cycle is a cycle time, which is a design target property, $\Sigma ti$ is the total of signal propagation delay between input and output terminals of each circuit i (22) between the flip-flops 21, that is, a signal path delay in the LSI, and K is the sum of the setup time of the flip-flops 21 and the skew of the clock signal 23.

The maximum value (the worst value) of the $\Sigma ti$ can be obtained by simulation of delay variation in a circuit operation, or a method of using derating factors, which are coefficients that represent the influence of various delay variation factors, is known as an approach for saving work load for design. More specifically, this is a method of designing by roughly estimating the worst conditions from a typical delay, as shown in the following equation (2).

$$t \text{ worst} = t \text{ typ} \times P \times V \times T \tag{2}$$

where t worst is the maximum value (the worst value) of each signal path delay, t typ is a typical value of each signal path delay, P is a delay variation coefficient in accordance with production deviation, V is a delay variation coefficient in accordance with the amount of a supply voltage variation width, and T is a delay variation coefficient in accordance with the amount of a temperature variation width. The difference between the t worst and the t typ is a margin amount for the delay variation to be considered.

The typical value t typ of the signal path delay can be obtained by a quite smaller scale simulation than by a simulation where the maximum value of the delay variation is obtained. If the typical values of all the signal path delays of the LSI are obtained, the worst value can be obtained efficiently, simply by multiplying these typical values by the derating factors P, V, and T. Such an approach is more often used for LSI design for specific applications such as ASIC than for the types for which a custom design is often used, such as microprocessors.

LSIs have their lifetime as other products, and disorder or malfunction occurs in a certain period of operation time after production. As the main causes of disorder or malfunction, property deterioration due to the hot carrier phenomenon, or breakage of wiring or short-circuit due to electromigration is known. In particular, in recent LSIs, miniaturization of transistors has been rapidly developed with the development of production techniques, so that the electric field in each component of the LSI tends to be high. Therefore, a high electric field occurring in the vicinity of a drain of MOS transistor causes impact ionization of carriers, so that hot carriers having high energy are likely to be generated. The hot carriers cause damage to a gate oxide film, and thus causes aging changes in the threshold voltage or the drain current of a transistor over time, that is, property deterioration. Consequently, this may change the operation frequency property or the like of the LSI, which is an assembly of the transistors, and finally may cause malfunction to the LSI. Therefore, in the design of the LSIs, it is essential to ensure the reliability in accordance with a desired lifetime of the product, so that in general, a design tolerance for deterioration of the LSI, that is, an aging deterioration margin amount is included.

More specifically, the signal path delay shown in the equation (1) is not constant throughout the elapse of the operation time of the LSI, but is changed by the hot carrier phenomenon or the like. The degree of the delay change due to the hot carrier phenomenon depends on the type of the circuit, the operating conditions of the circuit (e.g., the supply voltage, the temperature, the number of switching operations, the slew rate of an input signal, whether a signal transition is to go high or low, and an output signal load or the like), and the production deviation of the circuit properties, and usually is increased. Taking this aging deterioration into account, it is not sufficient to satisfy the equation (1) and it is necessary to satisfy the following equation (3) in order to guarantee the operation throughout the product lifetime of the LSI.

$$t \text{ cycle} \geq \Sigma(ti+\Delta ti) + K(i=1 \text{ to } N) \tag{3}$$

where $\Sigma \Delta ti$ is a variation amount of the signal path delay due to deterioration. Thus, when designing a LSI, it is necessary to make allowance for the influence of delay increments due to deterioration, and to include a design tolerance, that is, an aging deterioration margin amount so that the equation (3) is satisfied.

If the aging deterioration margin amount included at the time of the design of the LSI is too small, the reliability is not sufficient so that a malfunction may be caused before the desired product lifetime expires in the future. On the other hand, if the aging deterioration margin amount is too large, the reliability is excessive. In general, the reliability and the performance of the LSI has a trade-off relationship, so that excessive reliability results in degraded performance (e.g., operation frequency) of the LSI. Therefore, when a suitable aging deterioration margin amount cannot be set, it is difficult to develop LSIs for which both high performance and reliability are required, such as microprocessors.

Examples of a method of testing the design of a LSI with making an allowance for aging deterioration as described above include a method described in U.S. Pat. No. 5,634,001. In this method, a LSI is designed by using the simulation technique disclosed in U.S. Pat. No. 5,533,197 to predict the operation timing property of the LSI after the operation for the desired product lifetime, that is, all the signal path delays after deterioration of the LSI shown in equation (3), based on the design information of the LSI in the design process, and confirming with simulations that the delay after deterioration of the most delayed signal path (critical path) is within the cycle time. In this manner, it is attempted to include neither too much nor too little aging deterioration margin amount.

However, the method for predicting all the signal path delays after deterioration of the LSI with the simulation technique as described above results in a large amount of calculations, so that calculation takes much time, and a large scale apparatus is required.

On the other hand, similarly to the margin amount before deterioration described with reference to equation (2), it is conceivable to easily obtain the aging deterioration margin amount for allowance for aging deterioration with the derating factors. In such a case, it is necessary to set suitable values for the derating factors. However, the magnitude of such derating factors is affected by various more factors such as the type of the circuit, the history of the operating conditions, the deviation in the deterioration degree, than that of the derating factors for obtaining the margin amount before deterioration. Therefore, such derating factors cannot be obtained easily. In the conventional designing method described in the above U.S. Patent, the worst delays both before and after deterioration in all the signal paths are obtained directly by simulations at the time of the design of the LSI, and therefore applying this method to the design method using the derating factors based on equation (2) is not taken into account.

The aging deterioration margin amount is required to be included, not only in the design stage of the LSI, but also in inspection in the production stage. More specifically, in order to guarantee the desired product lifetime of a LSI (e.g., 10 years), it is necessary not only to test whether or not the LSI can operate normally at a time before deterioration, that is, immediately after the production of the LSI (before going to the market), but also to check whether or not the LSI can operate normally over the period of time of the production lifetime, that is, whether or not the aging deterioration margin amount is sufficient and is not excessive. For such checking, a technique for inspecting LSIs with a voltage lower than the supply voltage that guarantees the operation, such as described in U.S. Pat. No. 5,634,001, is known.

More specifically, the LSI operable cycle time depends on the supply voltage. As shown by the solid line in FIG. 2, when the supply voltage is high, the operable cycle time is short (the operable frequency is high), and when the supply voltage is low, the operable cycle time is long (the operable frequency is low). When the signal path delay is deteriorated as aging, the relationship between the supply voltage and the operable cycle time is as shown by the broken line in FIG. 2. In other words, for example, when the same supply voltage is applied before and after deterioration, the operable cycle time after deterioration is longer than before deterioration.

First, with respect to a targeted LSI, the relationship between the supply voltage and the operable cycle time (solid line in FIG. 2) before aging deterioration (beginning-of-life) is obtained by actual measurement. In addition, a delay t BOL at the path (critical path) having the largest signal path delay before aging deterioration and a delay t EOL at the critical path after aging deterioration (after a continuous operation for the desired production lifetime: end-of-life) are obtained by aging simulations. Then, based on these values, supply voltages V BOL and V EOL that allow operation at the cycle times corresponding to the delays t BOL and t EOL, respectively, of the LSI before aging deterioration are obtained, and the difference $\Delta V = V\,BOL - V\,EOL$ is calculated. Then, a voltage (VDDmin−$\Delta V$) lower by the difference $\Delta V$ than the operation guarantee minimum voltage VDD min is applied to the LSI before deterioration, and when the LSI operates at the cycle time corresponding to the delay t BOL under the voltage (VDDmin−$\Delta V$), the LSI is determined to be non-defective. When the LSI does not operate, the LSI is determined to be defective. In other words, it is estimated whether or not the LSI is operable after aging deterioration by converting an increment $\Delta t = t\,EOL - t\,BOL$ of the delays before and after aging deterioration to the difference $\Delta V$ between the supply voltages.

However, the method for inspecting LSIs using the supply voltage difference $\Delta V$ obtained by actual measurement after production of the targeted LSI has the following problems. As shown in FIG. 3, assuming that a signal path A is the critical path in a fresh LSI, based on that path, apparently, it is possible to obtain the supply voltage difference $\Delta V$ by simulations and actual measurement as above, and to check an apparent delay increment $\Delta t$ corresponding to the aging deterioration of the signal path A by controlling the supply voltage based on the difference. (Therefore, in the method of the above reference, an LSI in the initial state is inspected not by using VDD min as the supply voltage as shown in (1) of FIG. 3, but by reducing to (VDD min−$\Delta V$) to increase the delay as shown in (2) of FIG. 3 so that the delay after deterioration of (3) of FIG. 3 is simulated.) However, in reality, the relationship between the supply voltage and the delay and the relationship between the operation time and the delay are non-linear, and these relationships are different between signal paths. Therefore, even if a LSI is determined to be non-defective in an inspection with the supply voltage difference $\Delta V$ set at the signal path A, the LSI does not necessarily operate normally during deterioration, and the opposite case can be true. More specifically, with respect to another signal path B that has the same signal path delay as that of the signal path A at a supply voltage VDD min in the initial state as shown in (4) of FIG. 3, even if in an inspection with the supply voltage (VDD min−$\Delta V$) as shown in (5) of FIG. 3, the delay is within a design targeted delay so that it is determined that there is no problem, there is a possibility that the delay after deterioration in reality is beyond the design targeted delay, resulting in the malfunction, as shown in (6) of FIG. 3.

As described above, the conventional design method for LSIs has the problem that the aging margin amount including an allowance for aging deterioration cannot be obtained easily. Furthermore, in the method of inspecting with adjusting the supply voltage at the inspection to check whether or not the aging margin amount is sufficient and not excessive, that is, the inspection method of inspecting with setting the supply voltage to be low, the actually deteriorated properties of the circuits cannot be reflected, so that there is a possibility that an appropriate inspection cannot be performed.

SUMMARY OF THE INVENTION

Therefore, with the foregoing problems in mind, it is an object of the present invention to provide an apparatus and a method for calculating an aging deterioration margin amount of LSIs and that allow an aging deterioration margin amount including an allowance for aging deterioration to be obtained easily, for example, with derating factors. Furthermore, it is another object of the present invention to provide an inspection method for LSIs that allows appropriate inspection including an allowance for aging deterioration.

In order to achieve the above objects, the present invention is directed to an apparatus for calculating an aging deterioration margin amount of a LSI for calculating an aging deterioration margin amount to be included as a design tolerance with respect to a property of the LSI so that the LSI can operate even if the property deteriorates. The apparatus includes beginning-of-life property generating means for obtaining a property before deterioration of the property in an initial state of the LSI with respect to at least a part of a plurality of signal paths constituting the LSI; end-of-life property generating means for obtaining a property after deterioration of the property when a predetermined operation period has passed under a predetermined operating condition with respect to at least a part of a plurality of signal paths constituting the LSI; property deterioration degree generating means for obtaining a property deterioration degree which is a ratio of the property after deterioration to the property before deterioration in a signal path having a smallest tolerance of the property after deterioration with respect to a property necessary for the LSI to operate of the plurality of signal paths; and aging deterioration margin amount generating means for substantially obtaining an aging deterioration margin amount based on the property before deterioration and the property deterioration degree.

Thus, in general, the property before deterioration can be obtained comparatively easily, compared with the property after deterioration. Therefore, if the property deterioration degree of a certain LSI is obtained, an aging deterioration margin amount can easily be obtained without obtaining the property after deterioration every time for other LSIs or the like. The aging deterioration margin amount may be obtained, not only for other LSIs, but also for the same LSI that has been subjected to design change, or other signal paths of the same LSI for which the property after deterioration has not been obtained. Herein, the actually obtained value is not necessarily the aging deterioration margin itself, but can be in the form matched with the design circumstances using the value, such as the total of the property amount used as the reference and the aging deterioration margin amount, or the inverse number thereof. As long as the value substantially includes the information of the aging deterioration margin amount as described above, the present invention can be applied thereto and the same effects are provided.

Furthermore, a predetermined tolerance may be included in the aging deterioration margin amount obtained in the above-described manner. In other words, the aging deterioration amount can be increased or decreased, for example, to enhance the reliability with respect to the influence of the factors that are difficult to take into account when obtaining the property after deterioration, or to broaden the tolerance range of the reliability (to allow a reduction of the reliability to some extent).

Furthermore, the property after deterioration is not necessarily obtained for all signal paths, but may be obtained for a group of signal paths having a small tolerance of the property before deterioration with respect to the property necessary for the LSI to operate of a plurality of groups into which a plurality of signal paths constituting the LSI are divided. In other words, the property after deterioration is obtained only for the signal paths whose property after deterioration has high possibility of being used to obtain the property deterioration degree, and is not obtained for signal paths having a sufficient tolerance for the property before deterioration, and thus the computation amount is reduced and the processing efficiency of the entire apparatus can be increased.

Furthermore, the present invention can be applied to, for example, signal path delays. In this case, if the property deterioration degree is used as a derating factor corresponding to aging deterioration of the property and the delay before deterioration is multiplied by derating factors corresponding to each of at least a product deviation, a supply voltage variation, and a temperature variation as well as the derating factor corresponding to aging deterioration, the largest delay including the aging deterioration margin amount can be calculated easily.

Furthermore, the reliability of the LSI can be enhanced in the following manner. The supply voltage condition in the predetermined operating conditions when the end-of-life property generating means obtains the property after deterioration is different from a supply voltage condition under which the beginning-of-life property generating means and the end-of-life property generating means obtain the property before deterioration and the property after deterioration. Alternatively, the beginning-of-life property generating means and the end-of-life property generating means obtain the delay before deterioration and the delay after deterioration, using the property of the element whose delay before deterioration and delay after deterioration are largest (for example, the lowest responsibility of the element) in the range of the property deviation of elements constituting the LSI.

Furthermore, the apparatus for calculating an aging deterioration margin amount can be configured so as to include an aging deterioration margin amount generating means for substantially obtaining an aging deterioration margin amount, apart from the apparatus for obtaining the property deterioration degree as described above. In this case, it is not necessary that the apparatus has a function to obtain the property after deterioration to obtain the property deterioration degree, and therefore the aging deterioration margin can be obtained with a small-scale apparatus.

Furthermore, by inspecting the operation of the LSI, using the frequency obtained by multiplying the property deterioration degree obtained in the same manner as the aging deterioration margin amount as above by a predetermined frequency as the operation frequency, errors due to a non-linear relationship between the supply voltage and the delay cannot occur, for example, compared with the case where inspection is performed with the reduced supply voltage obtained by converting the difference between delays before and after deterioration to a supply voltage difference. Thus, underestimate or overestimate of the aging deterioration margin amount can be avoided without fail.

BRIEF DESCRIPTION OF THE DRAWINGS

FIG. 6 is a table showing an example of signal path delays before and after deterioration and signal path delay deterioration rates according to Embodiment 1 of the present invention.

DETAILED DESCRIPTION OF THE INVENTION

Hereinafter, embodiments of the present invention will be described by taking as example the case where a delay is used as a particular property noted as a subject for aging deterioration, and the deterioration degree of this property is defined as a delay deterioration rate.
(Embodiment 1)

Figure 1:
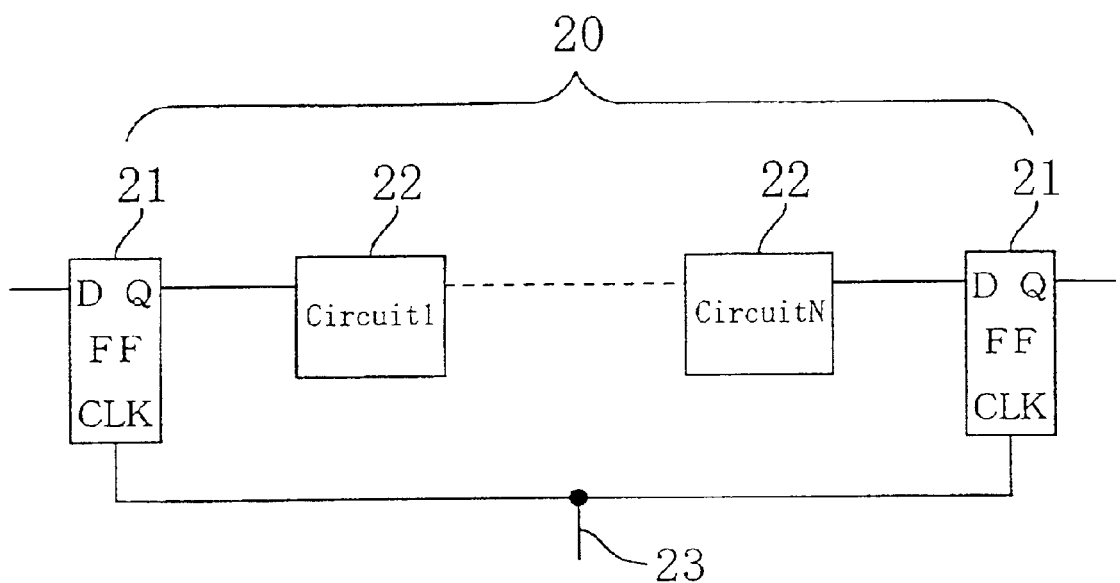
FIG. 1 is a circuit diagram showing a general configuration of a signal path.
Figure 2:
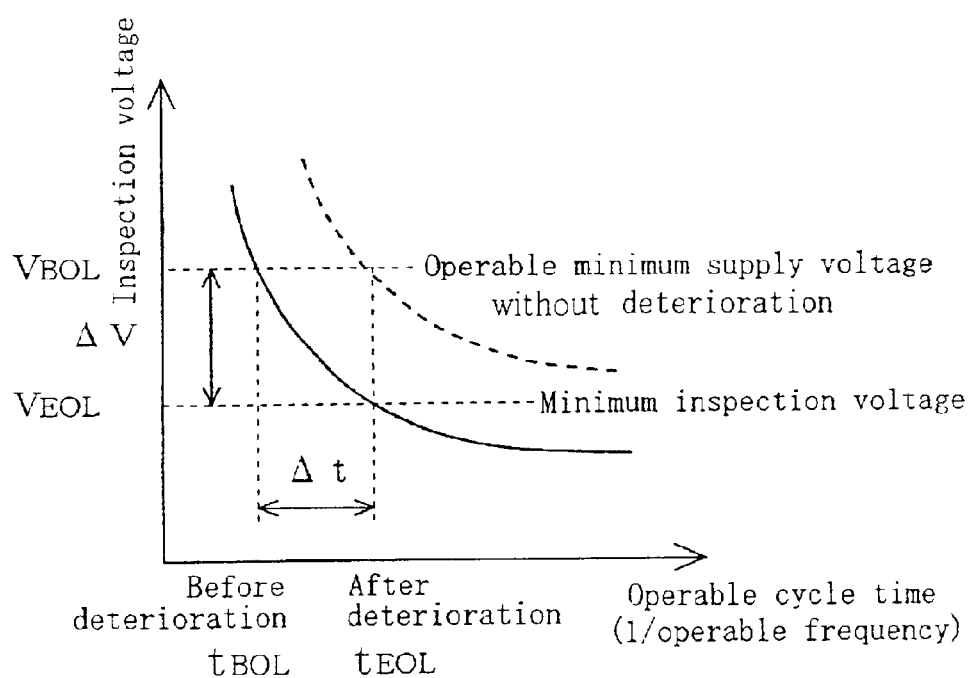
FIG. 2 is a graph showing the relationship between the cycle time and the inspection voltage for explaining a conventional inspection method.
Figure 3:
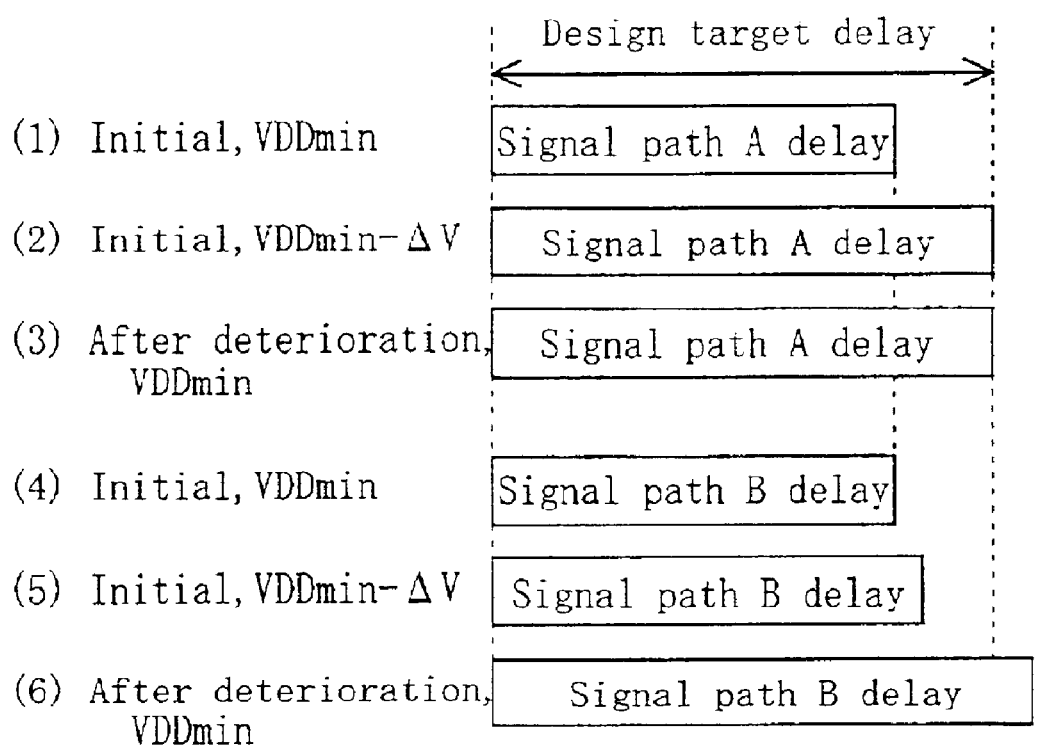
FIG. 3 is a diagram showing an example of delays before and after deterioration together with the supply voltage.
Figure 4:
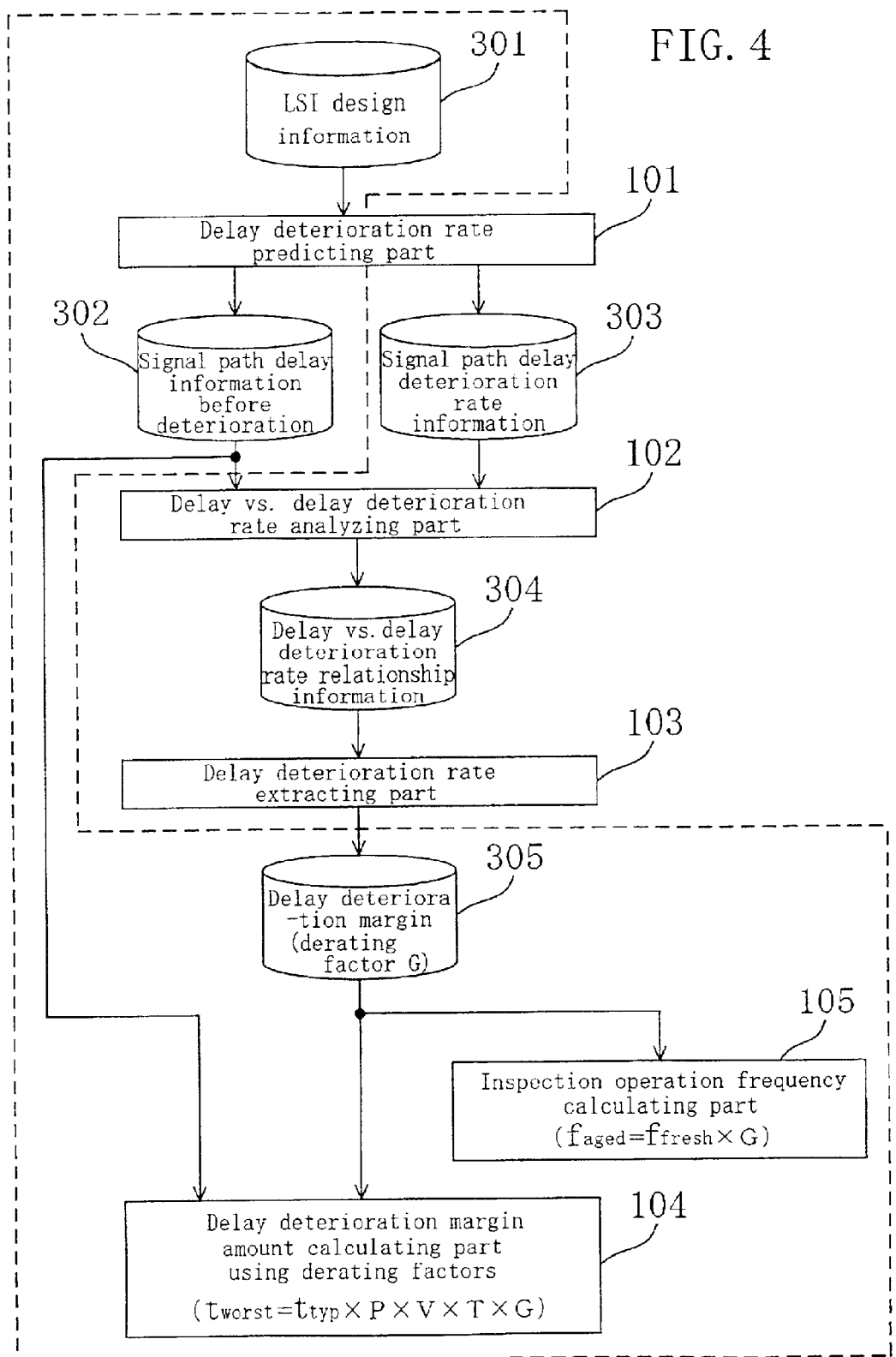
FIG. 4 is a block diagram showing the entire configuration of an apparatus for calculating an aging deterioration margin amount according to Embodiment 1 of the present invention.

FIG. 4 is a block diagram showing the entire configuration of an apparatus for calculating an aging deterioration margin amount used when designing and inspecting LSIs. In the configuration of FIG. 4, a delay deterioration rate predicting part 101 calculates an (initial) delay before deterioration (beginning-of-life property) of each of the signal paths constituting a LSI, based on LSI design information 301 to output signal path delay information before deterioration 302, and calculates a delay deterioration rate (property deterioration degree) when each signal path has operated over the desired period of the product lifetime to output signal path delay deterioration rate information 303. The LSI design information 301 includes all information necessary for the LSI design such as the types of included logic circuits, the net list indicating the connection relationship between logic circuits, parasitic element information in the connection wiring of logic circuits, mask shape information, production information, operating conditions (supply voltage, temperature, the switching probability, and operation frequency or the like) and a product lifetime target, etc, corresponding to the signal paths 20 shown in FIG. 1, for example. The LSI design information 301 and the following information are stored in a storing part, which is not shown.

A delay vs. delay deterioration rate analyzing part 102 reads the signal path delay information before deterioration 302 and the signal path delay deterioration rate information 303, and outputs delay vs. delay deterioration rate relationship information 304, which is information regarding correlation between the delay and the delay deterioration rate.

A delay deterioration rate extracting part 103 (property deterioration degree generating means) extracts a delay deterioration rate of a predetermined signal path described later, based on the delay vs. delay deterioration rate relationship information 304, and outputs it as a delay deterioration margin 305.

A delay deterioration margin amount calculating part 104 (aging deterioration margin amount generating means) using derating factors calculates a delay deterioration margin amount, using the delay deterioration margin 305 as a derating factor G.

An inspection operation frequency calculating part 105 calculates an operation frequency for inspection, using the delay deterioration margin 305 as a derating factor G, as in the delay deterioration margin amount calculating part 104.

Figure 5:
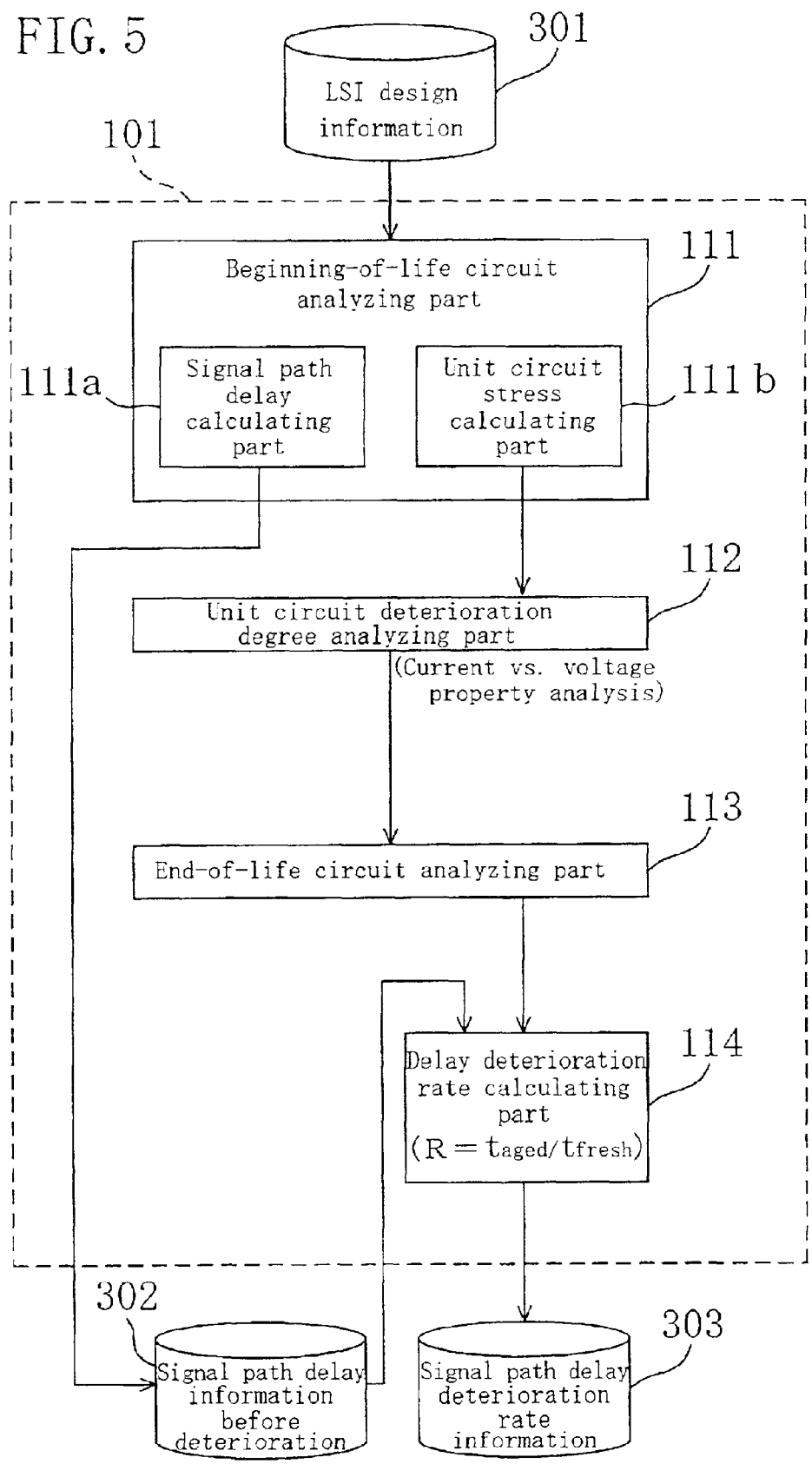
FIG. 5 is a block diagram showing a detailed configuration of a delay deterioration rate predicting part 101 according to Embodiment 1 of the present invention.

More specifically, as shown in FIG. 5 for example, the delay deterioration rate predicting part 101 includes a beginning-of-life circuit analyzing part 111 including a signal path delay calculating part 111a (beginning-of-life property generating means) for outputting beginning-of-life signal path delay information 302 and a unit circuit stress calculating part 111b for calculating a stress to a unit circuit such as transistors, a unit circuit deterioration degree analyzing part 112 for analyzing the current vs. voltage property based on information output from the unit circuit stress calculating part 111b, an end-of-life circuit analyzing part 113 (end-of-life property generating means) for obtaining a delay after deterioration based on the analysis results, and a delay deterioration rate calculating part 114 (property deterioration degree generating means) for outputting the signal path delay deterioration rate information 303 based on the obtained delay after deterioration and the signal path delay information before deterioration 302 output from the signal path delay calculating part 111a.

Next, the operation of the apparatus for calculating an aging deterioration margin amount configured as above will be described. The operation of this calculating apparatus can be categorized roughly into an operation for first analyzing a certain LSI to obtain the delay deterioration margin 305 and an operation for obtaining a delay deterioration margin amount and an operation frequency for inspection of a LSI other than one that is to be designed (or the above LSI when subjected to a design change), using the obtained delay deterioration margin 305. The operation of the former is performed by the delay deterioration rate predicting part 101, the delay vs. delay deterioration rate analyzing part 102, and the delay deterioration rate extracting part 103. The operation of the latter is performed by a part of the delay deterioration rate predicting part 101 (signal path delay calculating part 111a), the delay deterioration margin amount calculating part 104, and the inspection operation frequency calculating part 105 (elements included within a broken line in FIG. 4). Hereinafter, these two operations will be described more specifically.
(Operation for Obtaining a Delay Deterioration Margin)

The delay deterioration rate predicting part 101 calculates a delay before deterioration of each signal path included in a LSI, for example, based on a gate level timing degradation simulation method described in U.S. Pat. No. 5,974,247 and Japanese Laid-Open Patent Publication No. 10-124565, or a transistor level reliability method described in BTABERT User's Manual (BTA Technology Inc., USA), U.S. Pat. No. 5,533,197 or the like, and calculates a delay deterioration rate when each signal path has operated under predetermined operating conditions (supply voltage or operation frequency or the like) over the desired period of time of the product lifetime.

More specifically, in the beginning-of-life circuit analyzing part 111 of the delay deterioration rate predicting part 101, the signal path delay calculating part 111a analyzes the property of each signal path before deterioration, calculates signal path delay before deterioration, and outputs the result as the signal path delay information before deterioration 302. Furthermore, the unit circuit stress calculating part 111b analyzes the property of each signal path before deterioration as in the signal path delay calculating part 111a, and then calculates a stress to a unit circuit included in each signal path, such as each transistor, from bias conditions or the like. Then, the unit circuit deterioration degree analyzing part 112 analyzes the deterioration degree of the voltage vs. current property of the transistor in accordance with the stress. The end-of-life circuit analyzing part 113 analyzes the circuit property after deterioration using the deteriorated voltage vs. current property of the transistor, and obtains the signal path delay after deterioration. The delay deterioration rate calculating part 114 calculates a delay deterioration rate, based on the signal path delay after deterioration, and the signal path delay information before deterioration 302 output from the signal path delay calculating part 111a and outputs the results as the signal path delay deterioration rate information 303. This delay deterioration rate can be defined by the following equation (4).

$$R = t\text{ aged}/t\text{ fresh} \quad (4)$$

where t fresh and t aged are signal path delays before and after deterioration, respectively. FIG. 6 is a table showing specific examples (e.g., with respect to signal paths 1 to M) of the signal path delay before deterioration, signal path delay after deterioration, and the signal path delay deterioration rate.

Figure 7:
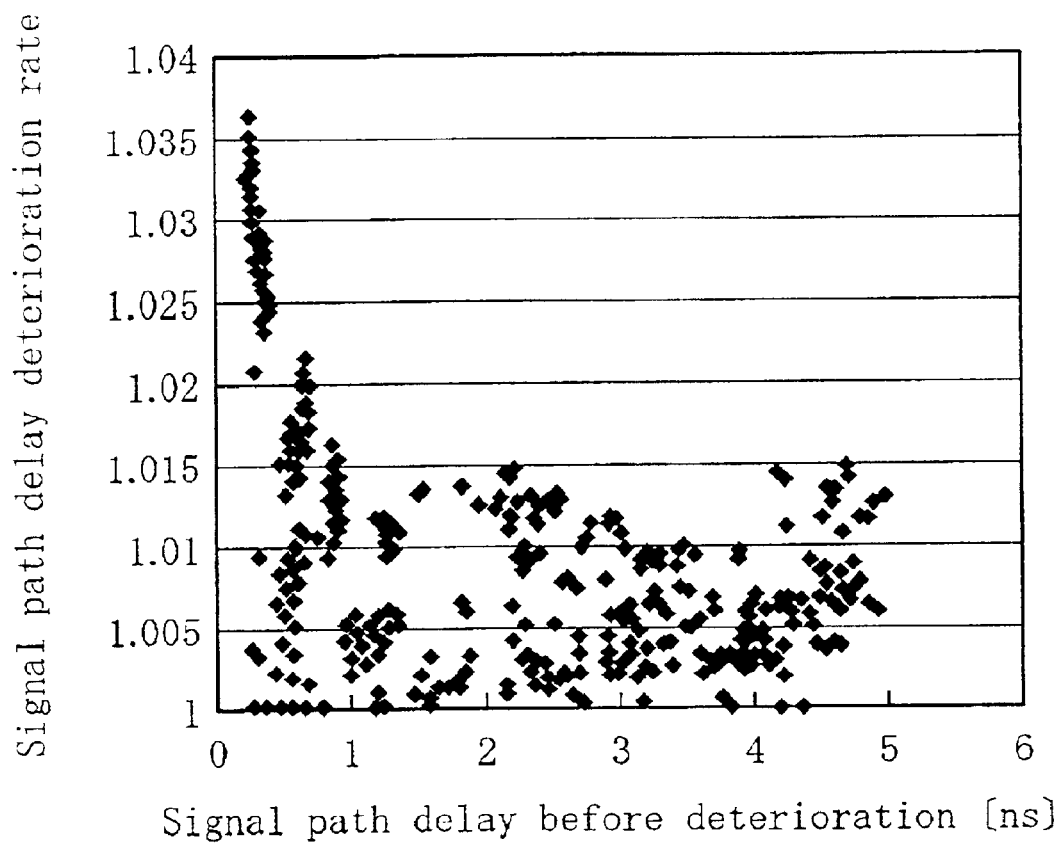
FIG. 7 is a graph showing an example of the relationship between the signal path delay before deterioration and the signal path delay deterioration rate according to Embodiment 1 of the present invention.

Next, the delay vs. delay deterioration rate analyzing part 102 obtains correlation between the signal path delay information before deterioration 302 and the signal path delay deterioration rate information 303 and outputs the delay vs. delay deterioration rate relationship information 304. FIG. 7 is a graph showing an example of the delay vs. delay deterioration rate relationship information 304. Each plot indicates the relationship between the signal path delay before deterioration and the signal path delay deterioration rate with respect to one signal path. When the inventors of the present invention actually performed calculations as described above with respect to various LSIs, roughly, it was found that there is a tendency that the larger the signal path delay before deterioration is, the smaller the signal path delay deterioration rate is, as shown in FIG. 7. It seems that this correlation is obtained for the following reason. The signal path having a large delay generally means that the signal path has a large number of logic circuit stages. In this case, in general, each logic circuit is configured so that the response is high, that is, so that the change of the output signal waveform is comparatively sharp, for example, by increasing the bias voltage. On the other hand, the signal path having a small number of logic circuit stages originally has a small delay, and therefore it is not particularly necessary to increase the response. Therefore, the output signal waveform is comparatively moderate. It is known that the more moderate the input waveform to the logic circuits is, the larger the hot carrier degradation is. Taking these into consideration, it can be qualitatively determined that the correlation results in the distribution shown in FIG. 7.

Figure 8:
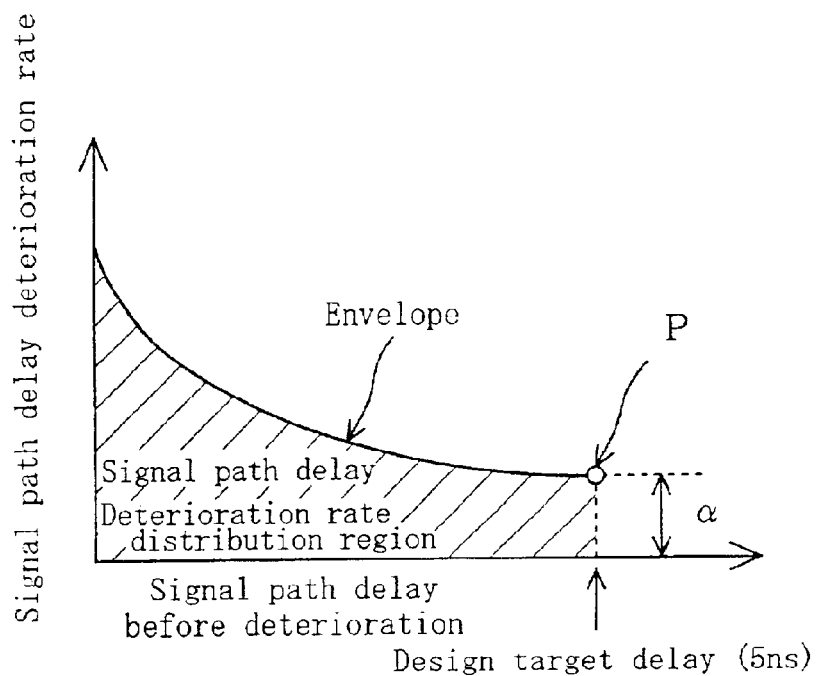
FIG. 8 is a graph with an envelope curve showing an example of the relationship between the signal path delay before deterioration and the signal path delay deterioration rate according to Embodiment 1 of the present invention.

To simplify FIG. 7 for convenience, the envelope of the upper limit of the signal path delay deterioration rate is as shown in FIG. 8, and the signal path delay deterioration rates are distributed in a hatched region of FIG. 8. The signal path that has the largest signal path delay before deterioration in this distribution, that is, is plotted in the vicinity of the design target delay (for example, cycle time: 5[ns] in this example) is a critical path.

The delay deterioration rate extracting part 103 extracts a signal path delay deterioration rate a at a point shown by a letter P in FIG. 8, based on the delay vs. delay deterioration rate relationship information 304 and outputs the signal path delay deterioration rate α as the delay deterioration margin 305. Herein, in FIG. 8, there are signal paths having a larger signal path delay deterioration rate than that at the point P. However, the signal path delay before deterioration of these paths is small, so that the signal path delay after deterioration (signal path delay before deterioration x signal path delay deterioration rate) is also small, and therefore these signal paths can be ignored because of sufficient tolerance in operation.

(Operation for Obtaining Delay Deterioration Margin Amount and Inspection Operation Frequency)

After the delay deterioration margin 305 is obtained in the above-described manner, this is used as a derating factor G to calculate the delay deterioration margin amount when designing other LSIs or changing the design of the same LSI, and the operation frequency for inspection in a simplified manner. More specifically, first, the signal path delay calculating part 111a of the beginning-of-life circuit analyzing part 111 in the delay deterioration rate predicting part 101 analyzes the property before deterioration of each signal path included in a LSI, calculates the signal path delay before deterioration, and outputs the result as the signal path delay information before deterioration 302, as described with reference to the operation for obtaining the delay deterioration margin. Then, the delay deterioration margin amount calculating part 104 obtains the delay under the worst conditions after deterioration with the following equation (5), based on the signal path delay information before deterioration 302 and the delay deterioration margin 305 as the derating factor G. Then, a LSI is designed so that the delay under the worst conditions is within the design target delay, and thus the LSI whose operation is guaranteed throughout the lifetime can be produced.

$$t\text{ worst} = t\text{ typ} \times P \times V \times T \times G \quad (5)$$

where t worst is the largest value (worst value) of the signal path delays, t typ is a typical value of the signal path delays (signal path delay information before deterioration 302), P is a delay variation coefficient in accordance with production deviation, V is a delay variation coefficient in accordance with the amount of the supply voltage variation width, and T is a delay variation coefficient in accordance with the amount of the temperature variation width. The difference between the cases of multiplying by G and not multiplying by G, that is, t typ×P×V×T× (G−1) is a delay deterioration margin amount.

Furthermore, for the operation frequency for inspection f aged, the inspection operation frequency calculating part 105 obtains it by multiplying the desired operation frequency f fresh by the derating factor G, as shown in equation (6).

$$f_{aged} = f_{fresh} \times G \quad (6)$$

The operation frequency for inspection obtained in the above described manner is supplied to a LSI, and it is checked whether or not the LSI operates normally, and thus an accurate inspection can be performed. In other words, reduction of a tolerance resulting from an increase of the delay to G times due to deterioration with respect to an operation frequency (cycle time) is equivalent to reduction of a tolerance resulting from an increase of the operation frequency to G times (the cycle time is 1/G times) with respect to the delay before deterioration. Therefore, compared with a conventional case where the difference between the delays before and after deterioration is converted to a supply voltage difference and inspection is performed with a reduced supply voltage, an error caused by the fact that the supply voltage vs. delay has a non-linear relationship cannot be occur, and underestimation or overestimation of the aging deterioration margin amount can be avoided without fail.

As described above, according to the apparatus for calculating an aging deterioration margin amount of this embodiment, the aging deterioration margin amount (or the maximum value of the signal path delay after deterioration directly corresponding to this amount) can be obtained easily, using the design method with derating factors. Moreover, an accurate inspection can be performed with an appropriate operation frequency for inspection.

Figure 9:
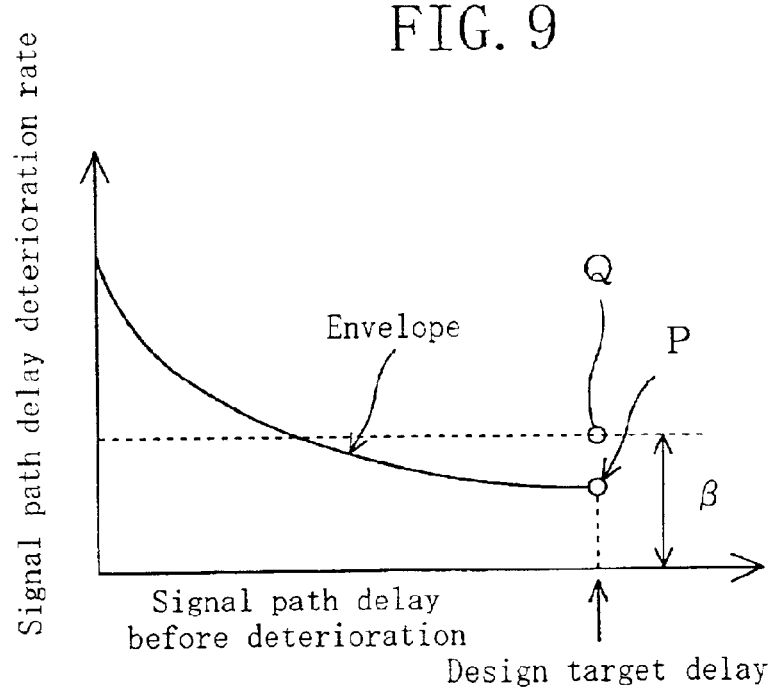
FIG. 9 is a graph for explaining an example for obtaining the delay deterioration rate according to Embodiment 1 of the present invention.

In the above example, the largest signal path delay deterioration rate of the critical path (the signal path delay deterioration rate a at point P of FIG. 8) is used as the delay deterioration margin 305. However, in order to enhance the reliability further, a value obtained by multiplying the delay deterioration margin 305 by a predetermined factor larger than 1 (e.g., a signal path delay deterioration rate β of a point shown by a letter Q of FIG. 9) can be used. In other words, the degree of delay deterioration may differ depending on the property of transistors constituting the circuit, or the influence of the overshoot of a signal generated by parasitic capacitance of wiring. In order to increase the safety factor in view of the factors causing the degree of the delay deterioration to differ, it is possible to multiply the delay deterioration margin 305 by a tolerance factor as described above, based on empirical statistical value. On the other hand, it is also possible to use a smaller value. Even if the value of the delay deterioration margin 305 is increased or reduced in this manner, the reliability of the obtained LSI results in one that is probabilistically managed, because the value of the delay deterioration margin 305 is increased or reduced based on the appropriately obtained value as above.

Figure 10:
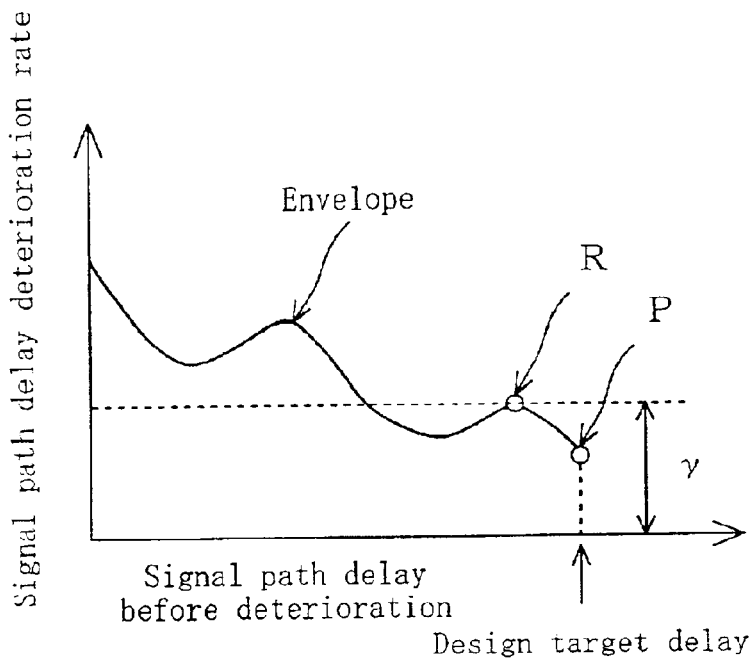
FIG. 10 is a graph for explaining another example for obtaining the delay deterioration rate according to Embodiment 1 of the present invention.

Furthermore, in the above example, the envelope of FIG. 8 based on the simulation results of the signal path delay before deterioration and the signal path delay deterioration rate decreases monotonically with respect to the signal path delay before deterioration. However, also in the case where the envelope has roughness, as shown in FIG. 10, an appropriate delay margin amount can be obtained as well. In this case, a delay deterioration rate γ of a point having the largest signal path delay after deterioration can be used, for example, as the point shown by a letter R in FIG. 10.

Furthermore, the signal path delay before deterioration and the signal path delay deterioration rate can be calculated with respect to all the signal paths to confirm that the envelope of FIG. 8 decreases monotonically with respect to the signal path delay before deterioration. However, in the case where a calculation has already been performed once, for example, and it is already known that the envelope decreases monotonically, only the signal paths in the vicinity of the critical path can be calculated to increase the efficiency, because the signal paths in the vicinity of the design target delay always supply the necessary signal path delay deterioration rate.

Figure 11:
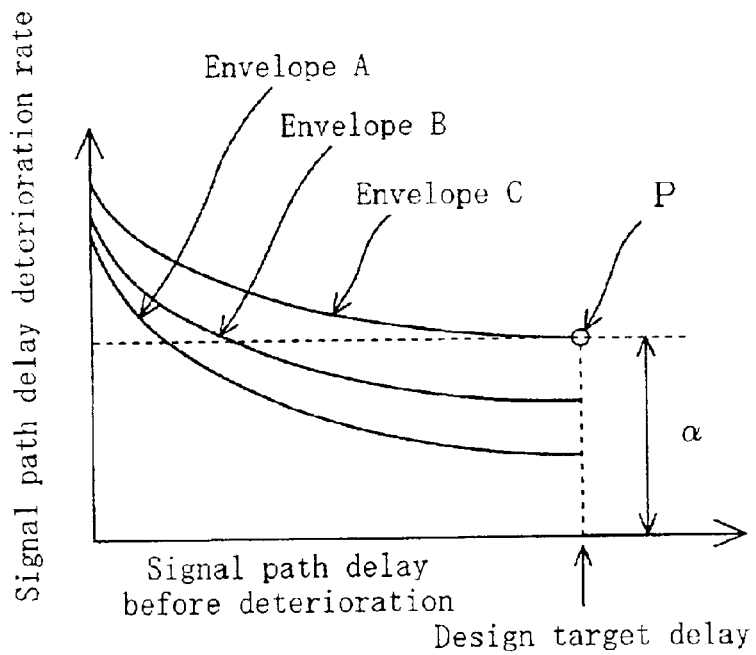
FIG. 11 is a graph for explaining still another example for obtaining the delay deterioration rate according to Embodiment 1 of the present invention.

Furthermore, when designing a LSI, the delay deterioration margin 305 obtained from other LSIs can be referred to. In this case, as shown in FIG. 11, the largest signal path delay deterioration rate (a: point P) of the signal path delay deterioration rates of the signal paths having the largest signal path delay before deterioration based on the envelopes A, B and C obtained in the same manner as in FIG. 8 from each LSI may be selected as a typical one and used as the delay deterioration margin.

Furthermore, in the above example, the delay is used as the property noted as a subject for aging deterioration. However, the present invention can apply to other various properties that are time-dependently deteriorated such as the frequency property. For example, in the case where the present invention applies to the frequency property, the same is true if the horizontal axis of FIG. 7 is indicated by (1/the frequency).

In the above example, for convenience, the relationship between the signal path delay before deterioration and the signal path delay deterioration rate as shown in FIG. 7 is obtained. However, in practice, the largest signal path delay of the signal path delays after deterioration obtained by the end-of-life circuit analyzing part 113 is extracted, and the signal path delay deterioration rate of this delay is used as the delay deterioration margin 305 (property deterioration degree generating means). Furthermore, the signal path delay after deterioration may not be obtained with respect to all the signal paths, but the signal paths are divided into groups, and the signal path delays of only the signal paths having a large signal path delay before deterioration (signal paths having a small tolerance before deterioration) that may become the largest signal path delay after deterioration may be obtained. In other words, in general, calculations of the signal path delays after deterioration tend to be large scale, because of repetitions in accordance with the circuit operations, compared with calculations of the signal path delays before deterioration. Such restriction as above allows the processing efficiency to be improved.

In the equation (5), calculations can be performed by distinguishing the derating factors for circuit delays from those for wiring delay. In other words, in general, the delay is the sum of delay by wiring itself and delay by other elements or the like, and therefore the largest delay of each kind can be obtained using a different derating factor.

Furthermore, in order to obtain the delay deterioration margin amount or the operation frequency for inspection based on the previously obtained delay deterioration margin, an apparatus can be configured so as to include only the elements enclosed within the broken lines in FIG. 4. In other words, an apparatus that allows aging deterioration margin amounts to be obtained in a simplified manner and at high speed by supplying the delay deterioration margins with a small scale.

(Embodiment 2)

The supply voltage of a LSI can be various values in the specification range thereof during the operation period from the initial state after going to the market to the end of the product lifetime, and the degree of hot carrier degradation can differ depending on the supply voltage applied during the operation period. In Embodiment 2, an apparatus for calculating an aging deterioration margin amount for obtaining an aging deterioration margin amount to enhance the reliability of the LSI by suitably setting the supply voltage as an operating condition, when obtaining the signal path delay information before deterioration 302 and signal path delay deterioration rate information 303 will be described. In this embodiment, the elements having the same function as in Embodiment 1 have the same reference numerals and will not be described further.

Figure 12:
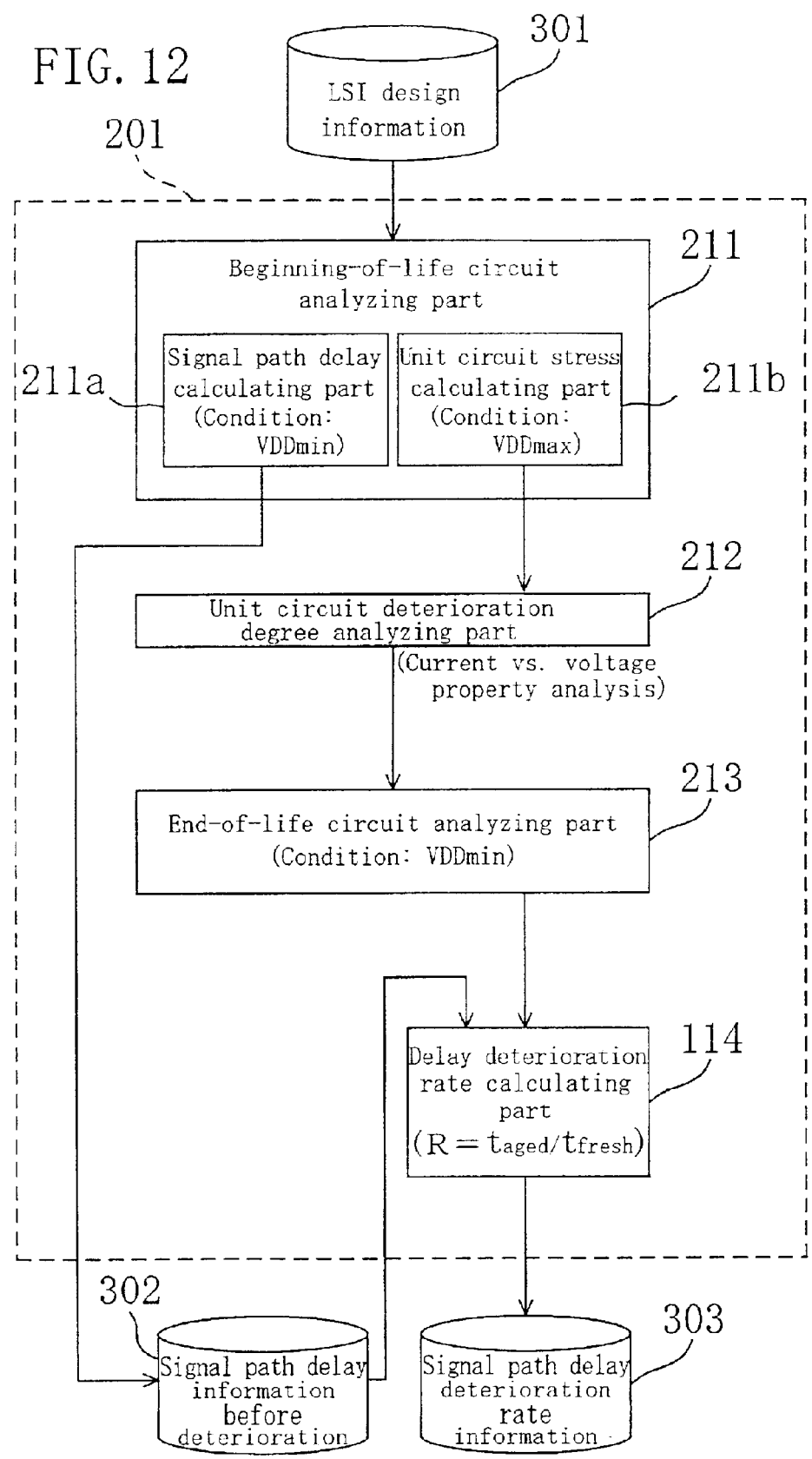
FIG. 12 is a block diagram showing a detailed configuration of a delay deterioration rate predicting part 201 of an apparatus for calculating an aging deterioration margin amount according to Embodiments 2 and 3 of the present invention.

The apparatus for calculating an aging deterioration margin amount of Embodiment 2 is different from that of Embodiment 1 (FIGS. 4 and 5) in that the apparatus of Embodiment 2 has a delay deterioration rate predicting part 201 instead of the delay deterioration rate predicting part 101, as shown in FIG. 12. A beginning-of-life circuit analyzing part 211, a unit circuit deterioration degree analyzing part 212, and an end-of-life circuit analyzing part 213 constituting the delay deterioration rate predicting part 201 have substantially the same functions as those of the elements constituting the delay deterioration rate predicting part 101 of Embodiment 1, except that the supply voltage used when obtaining the signal path delay information before deterioration 302 and the signal path delay deterioration rate information 303 is VDDmin or VDDmax. More specifically, a signal path delay calculating part 211a of the beginning-of-life circuit analyzing part 211 and an end-of-life circuit analyzing part 213 obtains the signal path delay information before deterioration 302 using the minimum supply voltage VDDmin. Furthermore, a unit circuit stress calculating part 211b and a unit circuit deterioration degree analyzing part 212 analyze the deterioration state of each signal path using the maximum supply voltage VDDmax as a maximum stress voltage.

Figure 13:
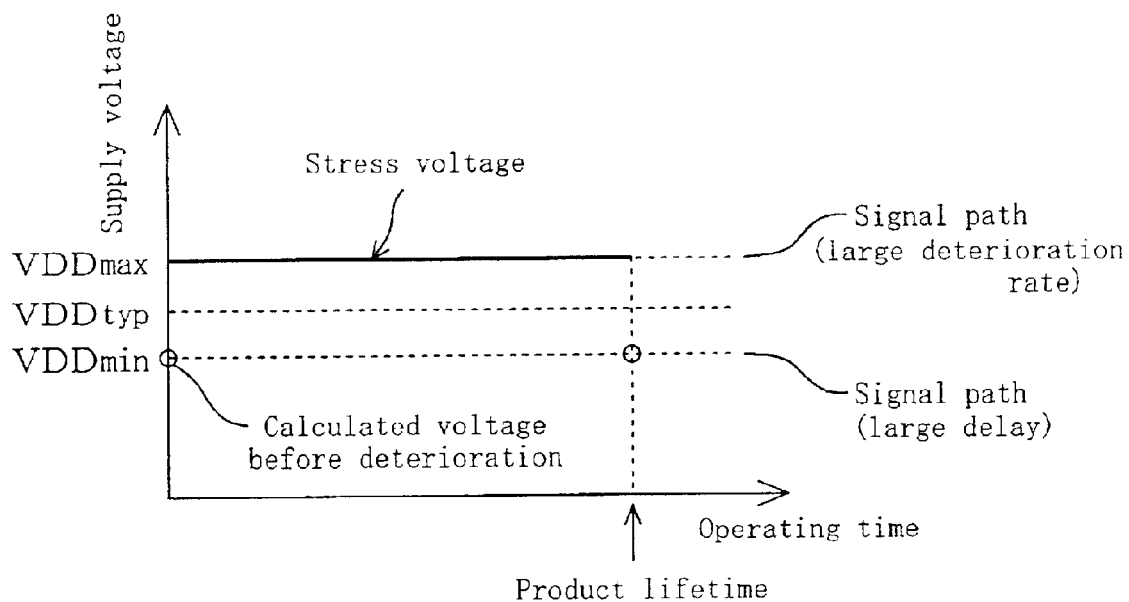
FIG. 13 is a graph for explaining an example of the supply voltage for obtaining the delay after deterioration of Embodiment 2 of the present invention.
Figure 14:
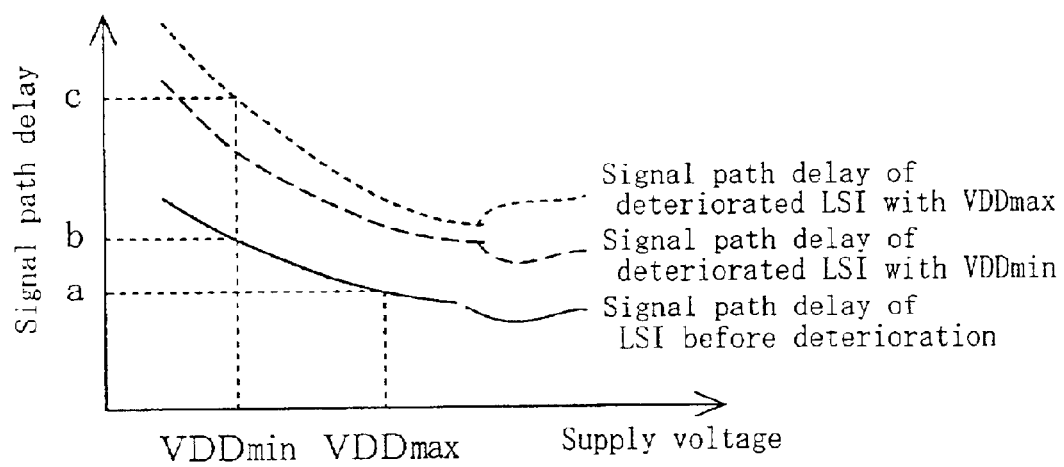
FIG. 14 is another graph for explaining an example of the supply voltage according to Embodiments 2 of the present invention.

Setting in the above-described manner results in obtaining a delay deterioration margin, using the maximum supply voltage VDDmax that provides the largest signal path delay deterioration rate information 303 as the voltage for operation up to the end of the product lifetime and the minimum supply voltage VDDmin that provides the largest signal path delay before deterioration, as shown in FIG. 13. More specifically, as shown in FIG. 14, the signal path delay after deterioration becomes larger as the applied supply (stress) voltage is higher during deterioration. In addition, the signal path delay becomes larger as the supply voltage is lower (e.g., b>a), regardless of before or after deterioration. Therefore, the following signal path delay (c in FIG. 14) is the largest signal path delay: a signal path delay when the deteriorated LSI that has been operated with the maximum supply voltage VDDmax is operated with the minimum supply voltage VDDmin. Thus, the worst value of the delay after deterioration can be obtained. This value is larger than the case the maximum supply voltage VDDmax is used in all the time, and this value can happen in a practical scene.

Therefore, by setting the supply voltage with the apparatus for calculating an aging deterioration margin amount including the delay deterioration rate predicting part 201 instead of the delay deterioration rate predicting part 101 of FIG. 4 in the above-described manner, the delay deterioration margin amount and the operation frequency for inspection under the worst conditions can be determined easily. Thus, a LSI having a higher reliability can be developed.

(Embodiment 3)

The properties of transistors generally are not uniform due to various factors in the production process, and the influence of hot carrier degradation is not uniform either. More specifically, the drain current and the response are typical properties that have a large deviation. In Embodiment 3, an apparatus for obtaining an aging deterioration margin amount that can obtain an aging deterioration margin amount to enhance the reliability of a LSI further by taking the property deviation of transistors into account, that is, suitably setting the production deviation conditions will be described.

Figure 15:
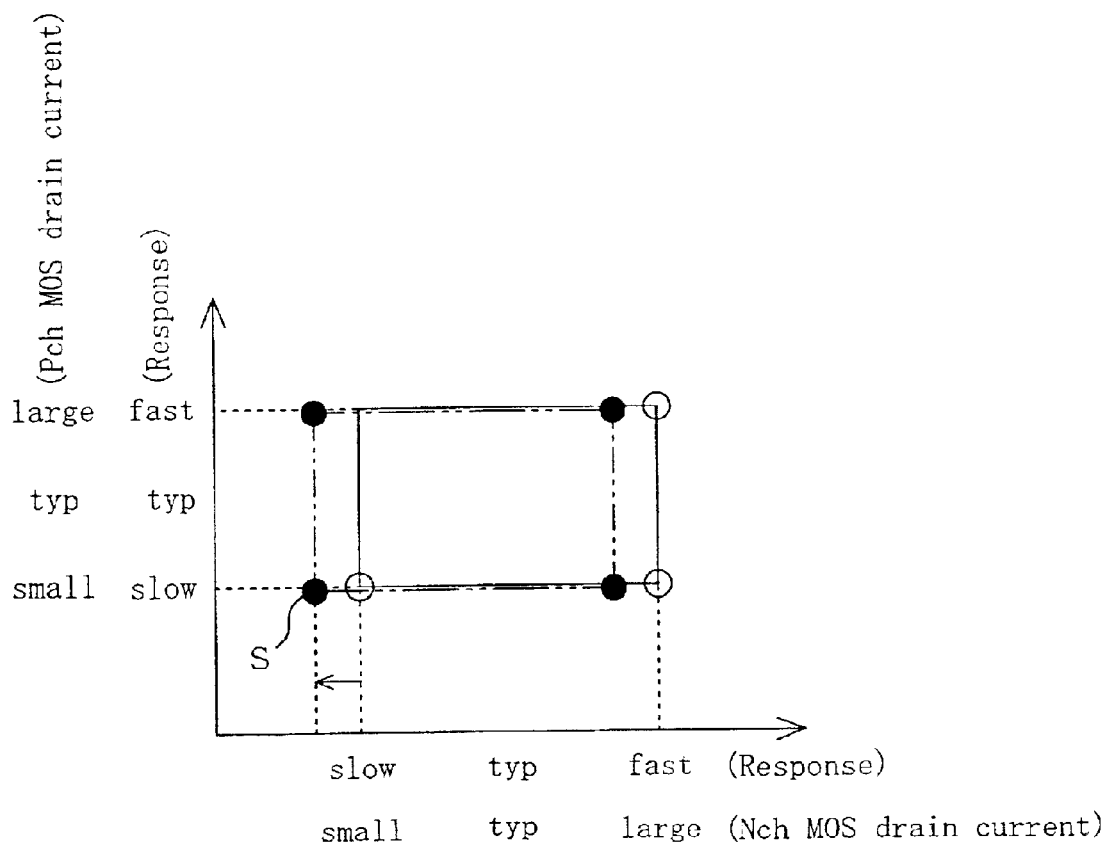
FIG. 15 is a graph showing an example of the property deviation of transistors constituting a LSI.

The apparatus for calculating an aging deterioration margin amount of Embodiment 3 has substantially the same configuration as that of Embodiment 2 (the same configuration except for having the delay deterioration rate predicting part 201 of FIG. 12 instead of the delay deterioration rate predicting part 101 of FIG. 4). However, the beginning-of-life circuit analyzing part 211, the unit circuit deterioration degree analyzing part 212 and the end-of-life circuit analyzing part 213 use the setting of the supply voltage described in Embodiment 2 when obtaining the signal path delay information before deterioration 302 and the signal path delay deterioration rate information 303, and use the property having the largest signal path delay in the deviation range of the property of transistors. In other words, for example, the magnitude of the drain current and the response of MOS transistors are not uniform in a predetermined range both for p channel MOS transistor and n channel MOS transistor. Therefore, the combination of the properties is in the range defined by the solid lines connecting blank circles (corner conditions) of FIG. 15. (More specifically, the corner conditions are indicated by, for example, SPICE parameters or BTABERT parameters (BTABERT User's Manual, BTA Technology Inc., USA) used for circuit simulations.) Furthermore, the degree of deterioration of the property of p channel MOS transistors is generally much smaller than that of n channel MOS transistors. On the other hand, the properties of the n channel MOS transistors deteriorate as shown by solid circles of FIG. 15, and therefore the combination of the properties is in the range defined by a double dotted chain lines. Taking the property deviation of the transistors into account by setting the deviation conditions using the corner conditions shown by a letter S in FIG. 15 in simulations in the beginning-of-life circuit analyzing part 211, the unit circuit deterioration degree analyzing part 212, and the end-of-life circuit analyzing part 213, the delay deterioration margin amount and the operation frequency for inspection under the worst conditions that can occur in a practical operation can be determined easily, making an allowance for the property deviation of the transistors. Therefore, a LSI having a higher reliability that can operate without fail even if the property of the transistors is varied in the range defined by the double dotted chain lines in FIG. 15 can be obtained.

When the influence of the property deviation of the transistors is larger than that of the setting of the supply voltage, the supply voltage may be set to a standard or a typical value and only the influence of the property deviation may be taken into account.

According to the present invention as described above, the aging deterioration margin amount can be obtained easily by obtaining the property deterioration degree of a LSI and without obtaining the property after deterioration every time for other LSIs. In other words, for example, an allowance for the aging deterioration of delays can be included in a design method using derating factors, so that the delays after deterioration can be obtained easily.

The above-described examples are only illustrative, and not limiting the present invention. Various other embodiments and modifications from the present invention can be made without departing from the substantial scope of the present invention.

What is claimed is:

1. An apparatus for calculating an aging deterioration margin amount of a LSI for calculating an aging deterioration margin amount to be included as a design tolerance with respect to a predetermined property of the LSI so that the LSI can operate even if the property deteriorates, comprising:

beginning-of-life property generating means for obtaining a property before deterioration of the property in an initial state of the LSI with respect to at least a part of a plurality of signal paths constituting the LSI;

end-of-life property generating means for obtaining a property after deterioration of the property when a predetermined operation period has passed under a predetermined operating condition with respect to at least a part of a plurality of signal paths constituting the LSI;

property deterioration degree generating means for obtaining a property deterioration degree which is a ratio of the property after deterioration to the property before deterioration in a signal path having a smallest tolerance of the property after deterioration with respect to a property necessary for the LSI to operate of the plurality of signal paths; and aging deterioration margin amount generating means for substantially obtaining an aging deterioration margin amount based on the property before deterioration and the property deterioration degree.

2. The apparatus for calculating an aging deterioration margin amount of a LSI according to claim 1, wherein the aging deterioration margin amount generating means obtains an aging deterioration margin amount that is a difference between a product of the property before deterioration and the property deterioration degree, and the property before deterioration.

3. The apparatus for calculating an aging deterioration margin amount of a LSI according to claim 1, wherein the aging deterioration margin amount generating means substantially obtains an aging deterioration margin amount by obtaining a product of the property before deterioration and the property deterioration degree.

4. The apparatus for calculating an aging deterioration margin amount of a LSI according to claim 1, wherein the aging deterioration margin amount generating means obtains the property before deterioration and the property deterioration degree, and further substantially obtains an aging deterioration margin amount based on a predetermined tolerance rate.

5. The apparatus for calculating an aging deterioration margin amount of a LSI according to claim 1, wherein the end-of-life property generating means for obtaining the property after deterioration with respect to signal paths of a group having a small tolerance of the property before deterioration with respect to a property necessary for the LSI to operate of a plurality of groups into which a plurality of signal paths constituting the LSI are divided.

6. The apparatus for calculating an aging deterioration margin amount of a LSI according to claim 1, wherein the aging deterioration margin amount generating means obtains the substantial aging deterioration margin amount with respect to a signal path different from the signal paths for which the property deterioration degree is obtained.

7. The apparatus for calculating an aging deterioration margin amount of a LSI according to claim 1, wherein the property before deterioration is a delay before deterioration, the property after deterioration is a delay after deterioration, the property deterioration degree is a delay deterioration rate the property necessary for the LSI to operate is a design target delay, and the aging deterioration margin amount is a delay deterioration margin amount.

8. The apparatus for calculating an aging deterioration margin amount of a LSI according to claim 7, wherein the aging deterioration margin amount generating means uses the property deterioration degree as a derating factor corresponding to aging deterioration of the property to calculate a largest delay including the aging deterioration margin amount by multiplying the delay before deterioration by derating factors corresponding to each of at least a product deviation, a supply voltage variation, and a temperature variation as well as the derating factor corresponding to aging deterioration of the property.

9. The apparatus for calculating an aging deterioration margin amount of a LSI according to claim 7, wherein a supply voltage condition in the predetermined operating conditions when the end-of-life property generating means obtains the property after deterioration is different from a supply voltage condition under which the beginning-of-life property generating means and the end-of-life property generating means obtain the property before deterioration and the property after deterioration.

10. The apparatus for calculating an aging deterioration margin amount of a LSI according to claim 7, wherein the beginning-of-life property generating means and the end-of-life property generating means obtain the delay before deterioration and the delay after deterioration, using the property of the element whose delay before deterioration and delay after deterioration are largest in a range of a property deviation of elements constituting the LSI.

11. The apparatus for calculating an aging deterioration margin amount of a LSI according to claim 10, wherein the property of the element whose delay before deterioration and delay after deterioration are largest is a lowest response of the element.

12. The apparatus for calculating an aging deterioration margin amount of a LSI according to claim 7, wherein a supply voltage condition in the predetermined operating conditions when the end-of-life property generating means obtains the property after deterioration is different from a supply voltage condition under which the beginning-of-life property generating means and the end-of-life property generating means obtain the property before deterioration and the property after deterioration, and the beginning-of-life property generating means and the end-of-life property generating means obtain the delay before deterioration and the delay after deterioration, using the property of the element in which a delay before deterioration and a delay after deterioration are largest in a range of a deviation of a property of elements constituting the LSI.

13. An apparatus for calculating an aging deterioration margin amount of a LSI for calculating an aging deterioration margin amount to be included as a design tolerance with respect to a predetermined property of the LSI so that the LSI can operate even if the property deteriorates, comprising:

aging deterioration margin amount generating means for substantially obtaining an aging deterioration margin amount, based on
  a property before deterioration of the property in an initial state of the LSI with respect to at least a part of a plurality of signal paths constituting the LSI; and
  a property deterioration degree obtained by obtaining a property after deterioration of the property when a predetermined operation period has passed under a predetermined operating condition with respect to at least a part of a plurality of signal paths constituting the LSI, and obtaining a ratio of the property after deterioration to the property before deterioration in a signal path having a smallest tolerance of the property after deterioration with respect to a property necessary for the LSI to operate of the plurality of signal paths, the ratio being the property deterioration degree.

14. A method for calculating an aging deterioration margin amount of a LSI for calculating an aging deterioration margin amount to be included as a design tolerance with respect to a predetermined property of the LSI so that the LSI can operate even if the property deteriorates, comprising:

a beginning-of-life property generating step for obtaining a property before deterioration of the property in an initial state of the LSI with respect to at least a part of a plurality of signal paths constituting the LSI;

an end-of-life property generating step for obtaining a property after deterioration of the property when a predetermined operation period has passed under a predetermined operating condition with respect to at least a part of a plurality of signal paths constituting the LSI;

a property deterioration degree generating step for obtaining a property deterioration degree which is a ratio of the property after deterioration to the property before deterioration in a signal path having a smallest tolerance of the property after deterioration with respect to a property necessary for the LSI to operate of the plurality of signal paths; and an aging deterioration margin amount generating step for substantially obtaining an aging deterioration margin amount based on the property before deterioration and the property deterioration degree.

15. A method for inspecting a LSI with respect to a predetermined property of the LSI so that the LSI can operate even if the property deteriorates, comprising:

obtaining a property before deterioration of the property in an initial state of the LSI with respect to at least a part of a plurality of signal paths constituting the LSI;

obtaining a property after deterioration of the property when a predetermined operation period has passed under a predetermined operating condition with respect to at least a part of a plurality of signal paths constituting the LSI;

obtaining a property deterioration degree which is a ratio of the property after deterioration to the property before deterioration in a signal path having a smallest tolerance of the property after deterioration with respect to a property necessary for the LSI to operate of the plurality of signal paths; and inspecting an operation of the LSI using a frequency obtained by multiplying the property deterioration degree by a predetermined frequency as an operation frequency.

\* \* \* \* \*